United States Patent
Oh et al.

(10) Patent No.: US 10,141,326 B1
(45) Date of Patent: Nov. 27, 2018

(54) SEMICONDUCTOR MEMORY DEVICE

(71) Applicant: SK hynix Inc., Gyeonggi-do (KR)

(72) Inventors: Sung-Lae Oh, Chungcheongbuk-do (KR); Dong-Hyuk Kim, Seoul (KR); Sang-Hyun Sung, Chungcheongbuk-do (KR); Seong-Hun Jung, Gyeonggi-do (KR); Soo-Nam Jung, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/885,328

(22) Filed: Jan. 31, 2018

(30) Foreign Application Priority Data

Sep. 5, 2017 (KR) .......................... 10-2017-0113308

(51) Int. Cl.
*H01L 27/11573* (2017.01)
*H01L 27/11524* (2017.01)
*H01L 27/11556* (2017.01)
*H01L 27/11529* (2017.01)
*H01L 27/11582* (2017.01)
*H01L 23/528* (2006.01)
*H01L 23/522* (2006.01)
*H01L 27/1157* (2017.01)
*G11C 16/08* (2006.01)
*G11C 16/24* (2006.01)

(52) U.S. Cl.
CPC ...... *H01L 27/11573* (2013.01); *H01L 23/528* (2013.01); *H01L 23/5226* (2013.01); *H01L 27/1157* (2013.01); *H01L 27/11524* (2013.01); *H01L 27/11529* (2013.01); *H01L 27/11556* (2013.01); *H01L 27/11582* (2013.01); *G11C 16/08* (2013.01); *G11C 16/24* (2013.01)

(58) Field of Classification Search
CPC ........... H01L 27/11573; H01L 27/1157; H01L 27/11529; H01L 27/11556; H01L 27/11524; H01L 27/11582; H01L 23/5226; H01L 23/528
See application file for complete search history.

(56) References Cited

U.S. PATENT DOCUMENTS 10,038,009 B2 * 7/2018 Lim .................. H01L 27/11582

FOREIGN PATENT DOCUMENTS

KR  1020160069903  6/2016
KR  1020160108052  9/2016

* cited by examiner

*Primary Examiner* — Hsien Ming Lee
(74) *Attorney, Agent, or Firm* — IP & T Group LLP (57) ABSTRACT

A semiconductor memory device includes a peripheral circuit element provided over a lower substrate; an upper substrate provided over an interlayer dielectric layer which partially covers the peripheral circuit element; a memory cell array including a channel structure which extends in a first direction perpendicular to a top surface of the upper substrate and a plurality of gate lines which are stacked over the upper substrate to surround the channel structure; and a plurality of transistors electrically coupling the gate lines to the peripheral circuit element. The transistors include a gate electrode provided over the interlayer dielectric layer and disposed to overlap with the memory cell array in the first direction; a plurality of vertical channels passing through the gate electrode in the first direction and electrically coupled to the gate lines, respectively; and gate dielectric layers disposed between the vertical channels and the gate electrode.

20 Claims, 8 Drawing Sheets

SEMICONDUCTOR MEMORY DEVICE

CROSS-REFERENCE TO RELATED APPLICATION

The present application claims priority to Korean Patent Application No. 10-2017-0113308 filed on Sep. 5, 2017, which is incorporated herein by reference in its entirety.

BACKGROUND

1. Technical Field

Various embodiments generally relate to a semiconductor memory device, and, more particularly, to a semiconductor memory device with an improved three-dimensional structure, capable of reducing the overall size of the semiconductor device.

2. Related Art

As efforts for improving the degree of integration in a semiconductor memory device with a two-dimensional structure, in which memory cells are formed in a single layer on a substrate, reach a limit, a semiconductor memory device with a three-dimensional structure, in which memory cells are three-dimensionally arranged on a substrate to improve the degree of integration, has been suggested.

As the degree of integration increases in such a three-dimensional semiconductor memory device, the number of transistors for coupling memory cells to a peripheral circuit element increases, and the area occupied thereby increases as well.

SUMMARY

In an embodiment, a semiconductor memory device may include: a peripheral circuit element provided over a lower substrate; an upper substrate provided over an interlayer dielectric layer which partially covers the peripheral circuit element; a memory cell array including a channel structure which extends in a first direction perpendicular to a top surface of the upper substrate and a plurality of gate lines which are stacked over the upper substrate to surround the channel structure; and a plurality of transistors electrically coupling the gate lines to the peripheral circuit element. The transistors may include a gate electrode provided over the interlayer dielectric layer and disposed to overlap with the memory cell array in the first direction; a plurality of vertical channels passing through the gate electrode in the first direction and electrically coupled to the gate lines, respectively; and gate dielectric layers disposed between the vertical channels and the gate electrode.

In an embodiment, a semiconductor memory device may include: a peripheral circuit element provided over a lower substrate; an upper substrate provided over an interlayer dielectric layer which covers the peripheral circuit element; a memory cell array including a channel structure which extends in a first direction perpendicular to a top surface of the upper substrate, a plurality of gate lines which are stacked over the upper substrate to surround the channel structure and a bit line which is coupled to the channel structure; and a transistor electrically coupling the bit line to the peripheral circuit element. The transistor may include a gate electrode provided over the interlayer dielectric layer and disposed to overlap with the memory cell array in the first direction; a vertical channel passing through the gate electrode in the first direction and electrically coupled to the bit line; and a gate dielectric layer disposed between the vertical channel and the gate electrode.

In an embodiment, a semiconductor memory device may include: a peripheral circuit element provided over a lower substrate; an interlayer dielectric layer formed over the lower substrate, and covering the peripheral circuit element; an upper substrate provided over the interlayer dielectric layer; a memory cell array stacked over the upper substrate; and a transistor provided between the memory cell array and the peripheral circuit element. The transistor may include a gate electrode disposed at the same layer as the upper substrate, and disposed to overlap with the memory cell array in the first direction; a vertical channel passing through the gate electrode in the first direction; and a gate dielectric layer disposed between the vertical channel and the gate electrode. The upper substrate and the gate electrode may be disposed in a planar manner over a top surface of the interlayer dielectric layer.

These and other features and advantages of the present invention will become more apparent to those with ordinary skill in the art of the present invention from the following detailed description in conjunction with the accompanying drawings

DETAILED DESCRIPTION

Hereinafter, a semiconductor memory device will be described below with reference to the accompanying drawings through various examples of embodiments.

Figure 1:
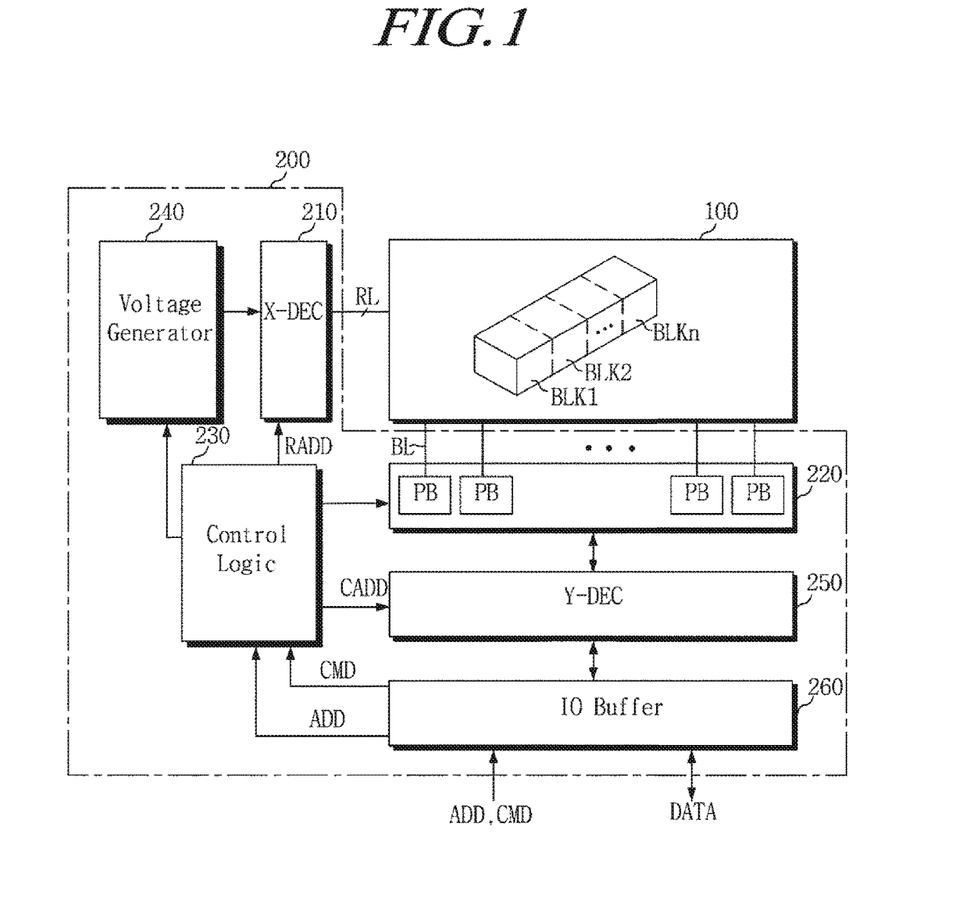
FIG. 1 is a block diagram illustrating a representation of an example of a semiconductor memory device in accordance with an embodiment.

FIG. 1 is a block diagram illustrating a representation of an example of a semiconductor memory device in accordance with an embodiment.

Referring to FIG. 1, the semiconductor memory device in accordance with an embodiment of the present invention may include a memory cell array 100 and a peripheral circuit 200. The peripheral circuit 200 may include a row decoder 210, a page buffer circuit 220, a control logic 230, a voltage generator 240, a column decoder 250 and an input/output buffer 260.

The memory cell array 100 may include a plurality of memory blocks BLK1 to BLKn. Each of the memory blocks BLK1 to BLKn may include a plurality of cell strings. Each of the cell strings may include a plurality of memory cells which are stacked on a substrate. In an embodiment, the memory cells may be nonvolatile memory cells.

The memory cell array 100 may be coupled to the row decoder 210 through row lines RL. The row lines RL may include at least one drain select line, a plurality of word lines and at least one source select line. The memory cell array 100 may be coupled to the page buffer circuit 220 through bit lines BL. Dedicated row lines RL may be coupled to each of the memory blocks BLK1 to BLKn. The bit lines BL may be coupled in common to the plurality of memory blocks BLK1 to BLKn.

The row decoder 210 may select any one among the memory blocks BLK1 to BLKn of the memory cell array 100, in response to a row address RADD provided from the control logic 230. The row decoder 210 may transfer operation voltages from the voltage generator 240, for example, a program voltage (Vpgm), a pass voltage (Vpass) and a read voltage (Vread), to the row lines RL coupled to a selected memory block. In particular, in a program operation, an operation voltage of a high level should be provided to the word lines of a selected memory block. In order to transfer a high voltage, the row decoder 210 may include pass transistors which are constructed by high voltage transistors.

The page buffer circuit 220 may include a plurality of page buffers PB which are coupled to the memory cell array 100 through corresponding bit lines BL. The page buffers PB may operate as write drivers or sense amplifiers depending on an operation mode. In a program operation, the page buffers PB may latch data DATA received through the input/output buffer 260 and the column decoder 250 and apply voltages necessary for storing the data DATA in selected memory cells through the corresponding bit lines BL in response to a control signal received from the control logic 230. In a read operation, the page buffers PB may read out data DATA stored in selected memory cells, through the bit lines BL, and output the read-out data DATA to an exterior through the column decoder 250 and the input/output buffer 260.

The control logic 230 may output a row address RADD in an address ADD received through the input/output buffer 260, to the row decoder 210, and output a column address CADD in the address ADD to the column decoder 250. The control logic 230 may control the page buffer circuit 220 and the voltage generator 240 to access selected memory cells, in response to a command CMD received through the input/output buffer 260.

The voltage generator 240 may generate various voltages required in the memory device. For example, the voltage generator 240 may generate a program voltage, a pass voltage, a select read voltage and an unselect read voltage.

The column decoder 250 may input program data to the page buffer circuit 220 in response to a column address CADD from the control logic 230.

Figure 2:
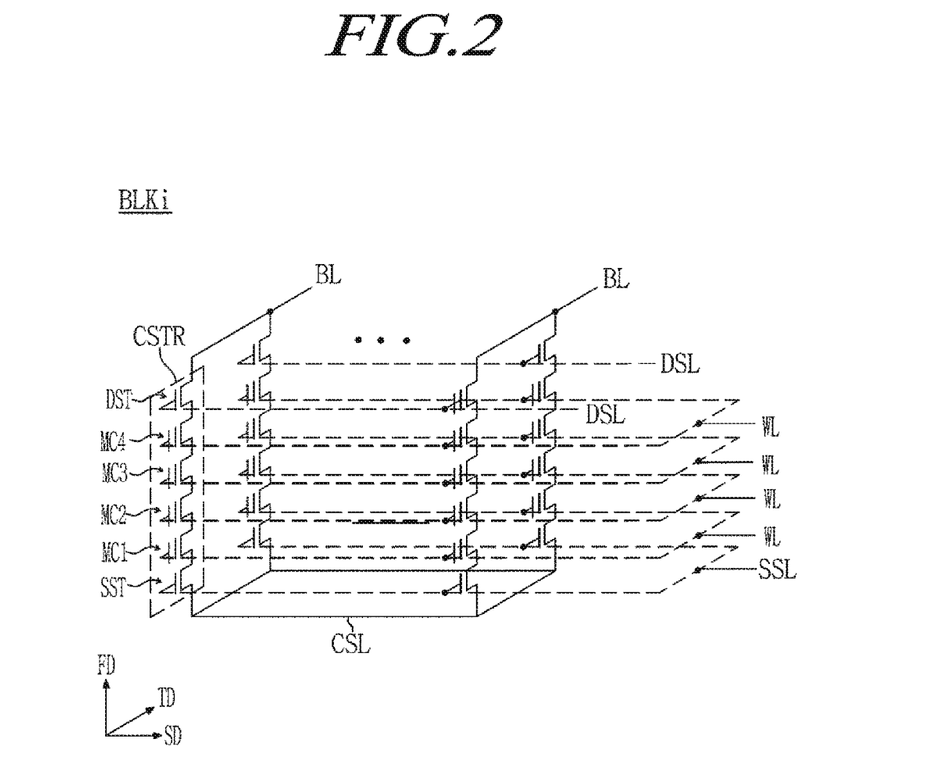
FIG. 2 is a circuit diagram illustrating a representation of an example of one of the memory blocks shown in FIG. 1.

FIG. 2 is a circuit diagram illustrating a representation of an example of any one of the memory blocks shown in FIG. 1.

Referring to FIG. 2, a memory block BLKi may include a plurality of cell strings CSTR which are coupled between a plurality of bit lines BL and a common source line CSL. The cell strings CSTR may be formed in a first direction FD that vertically projects from the top surface of a substrate (not shown).

In the accompanying drawings, the direction vertically projecting from the top surface of the substrate is defined as the first direction FD, and two directions parallel to the top surface of the substrate and intersecting with each other are defined as a second direction SD and a third direction TD, respectively. The second direction SD and the third direction TD may intersect substantially perpendicularly with each other. In the drawings, a direction indicated by an arrow and a direction opposite thereto represent the same direction.

At least one source select line SSL, a plurality of word lines WL and at least one drain select line DSL may be stacked in the first direction FD between the common source line CSL and the bit lines BL. The source select line SSL, the word lines WL and the drain select line DSL may extend in the second direction SD.

The bit lines BL may be arranged along the second direction SD at regular intervals and may each extend along the third direction TD. A plurality of cell strings CSTR may be coupled in parallel to each of the bit lines BL. The cell strings CSTR may be coupled in common to the common source line CSL. A plurality of cell strings CSTR may be coupled between the plurality of bit lines BL and one common source line CSL.

Each of the cell strings CSTR may include a source select transistor SST which is coupled to the common source line CSL, a drain select transistor DST which is coupled to a bit line BL, and a plurality of memory cells MC1 to MC4 which are coupled between the source select transistor SST and the drain select transistor DST. The source select transistor SST, the memory cells MC1 to MC4 and the drain select transistor DST may be coupled in series along the first direction FD.

The gates of source select transistors SST may be coupled to the source select line SSL. The gates of the memory cells MC1 to MC4 may be coupled to corresponding word lines WL, respectively. The gates of the drain select transistors DST may be coupled to corresponding drain select lines DSL, respectively.

While it is illustrated in the embodiment of FIG. 2 that four word lines WL are stacked, it is to be noted that the stack number of word lines is not limited thereto. For example, 8, 16, 32 or 64 word lines may be stacked along the first direction FD.

While it is illustrated in the embodiment of FIG. 2 that each of the source select line SSL and the drain select line DSL is disposed at one layer in the first direction FD, it is to be noted that source select lines SSL or drain select lines DSL may be disposed in at least two layers in the first direction FD.

Figure 3:
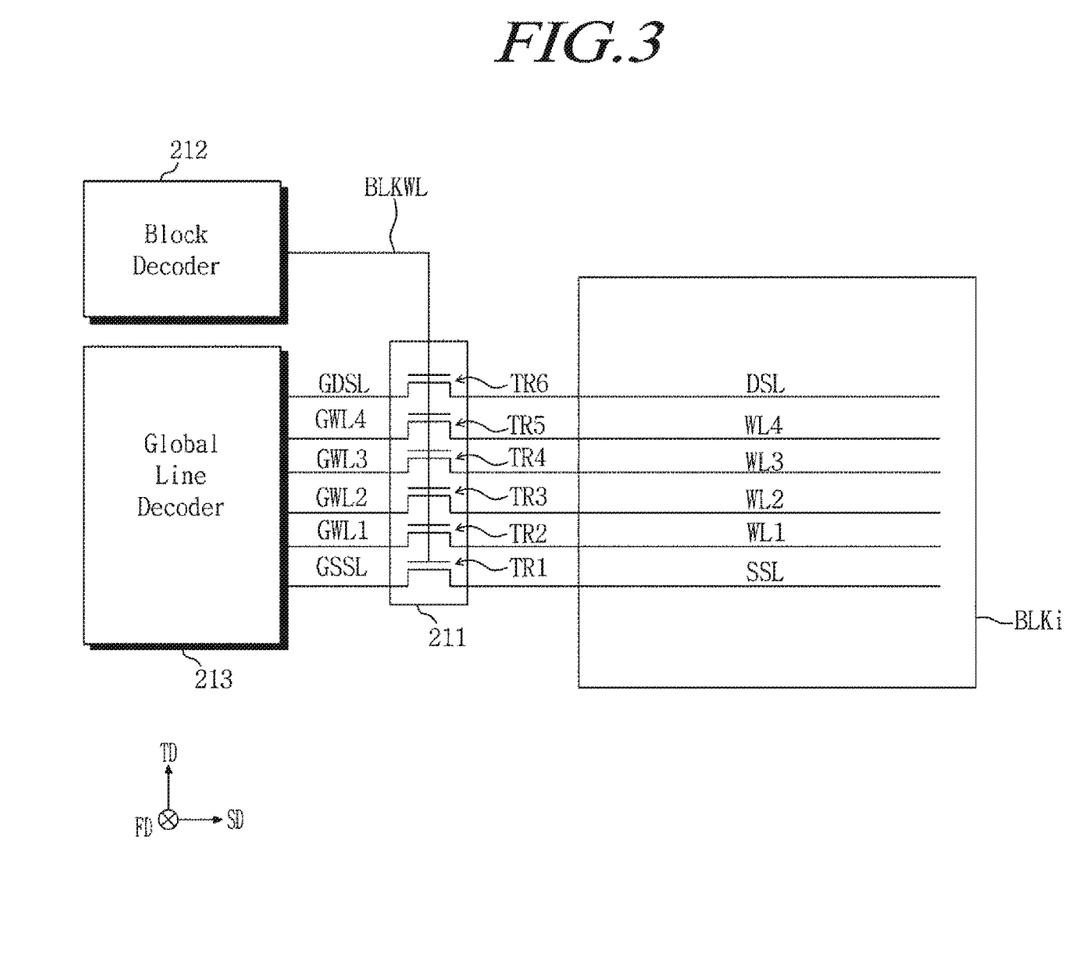
FIG. 3 is a circuit diagram illustrating an exemplary schematic configuration of the memory block and the row decoder of the semiconductor memory device in accordance with an embodiment of the present invention.

FIG. 3 is a circuit diagram illustrating an exemplary schematic configuration of the memory block and the row decoder of the semiconductor memory device in accordance with an embodiment of the present invention.

Referring to FIG. 3, the row decoder 210 may include a pass transistor circuit 211, a block decoder 212 and a global line decoder 213.

A dedicated pass transistor circuit 211 may be provided for each of the memory blocks BLK1 to BLKn. The block decoder 212 and the global line decoder 213 may be provided in common for the memory blocks BLK1 to BLKn.

The pass transistor circuit 211 may be coupled to a memory block BLKi through corresponding dedicated row lines SSL, WL1 to WL4 and DSL. The pass transistor circuit 211 may include a plurality of pass transistors for example, six transistors TR1 to TR6. The pass transistors TR1 to TR6 may couple the row lines SSL, WL1 to WL4 and DSL to corresponding global row lines GSSL, GWL1 to GWL4 and GDSL, respectively.

The global row lines GSSL, GWL1 to GWL4 and GDSL may be coupled to the drains, respectively, of the pass transistors TR1 to TR6, and the row lines SSL, WL1 to WL4 and DSL may be coupled to the sources, respectively, of the pass transistors TR1 to TR6. The pass transistors TR1 to TR6 may transfer the voltages applied to the global row lines GSSL, GWL1 to GWL4 and GDSL to the row lines SSL, WL1 to WL4 and DSL.

The block decoder 212 may be coupled to the pass transistor circuit 211 through a block word line BLKWL. The block decoder 212 may be provided with a block select signal from the voltage generator 240, and may transfer the block select signal provided from the voltage generator 240, to the block word line BLKWL in response to the control of the control logic 230.

The global line decoder 213 may be coupled to the pass transistor circuit 211 through the global row lines GSSL, GWL1 to GWL4 and GDSL. The global line decoder 213 may be provided with operation voltages from the voltage generator 240, and may transfer the operation voltages provided from the voltage generator 240, to the global row lines GSSL, GWL1 to GWL4 and GDSL in response to the control of the control logic 230.

The pass transistors TR1 to TR6 of the pass transistor circuit 211 may electrically couple the global row lines GSSL, GWL1 to GWL4 and GDSL and the row lines SSL, WL1 to WL4 and DSL in response to the block select signal of the block word line BLKWL, and may transfer the operation voltages applied to the global row lines GSSL, GWL1 to GWL4 and GDSL to the row lines SSL, WL1 to WL4 and DSL.

Figure 4:
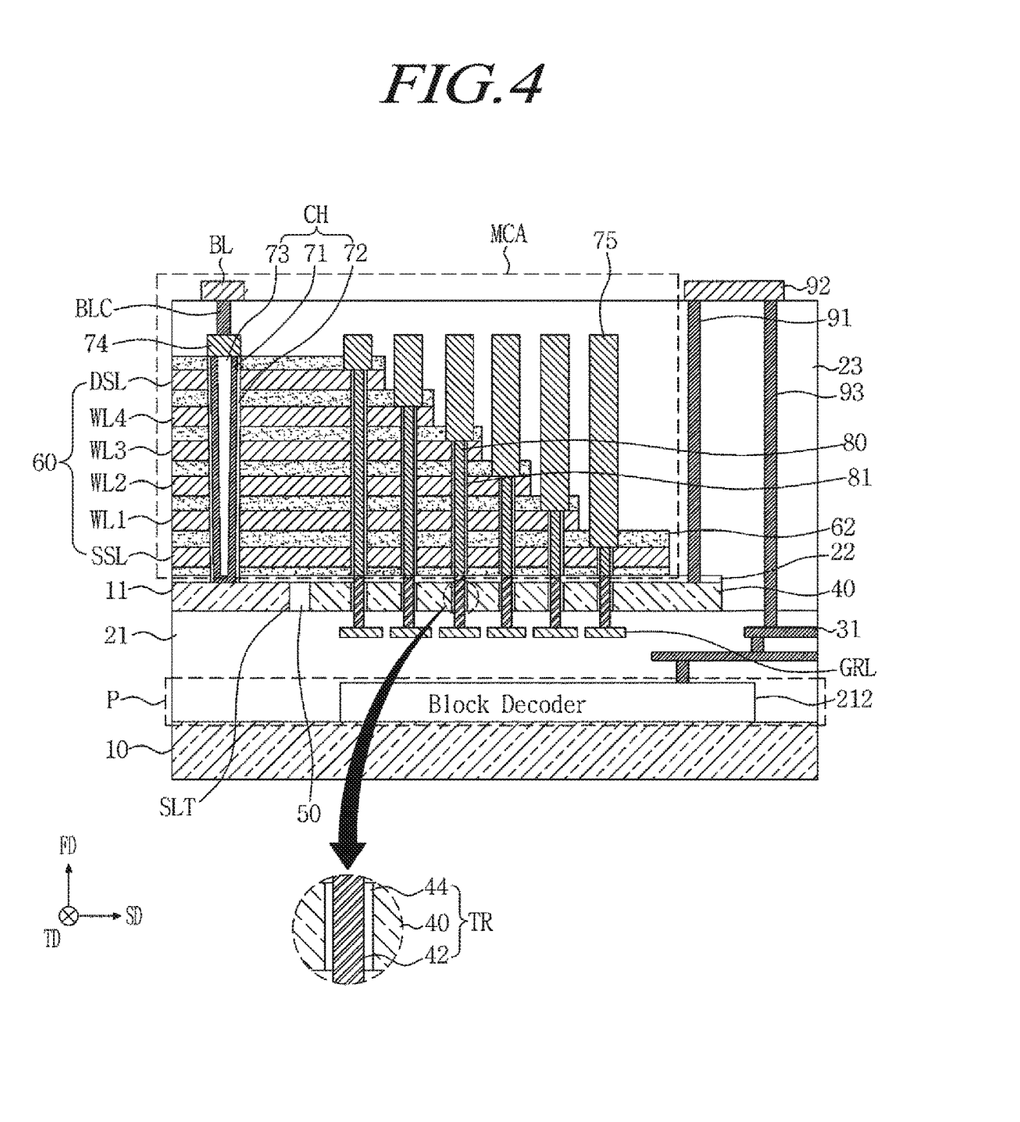
FIG. 4 is a cross-sectional view illustrating a representation of an example of a semiconductor memory device in accordance with an embodiment.

FIG. 4 is a cross-sectional view illustrating a representation of an example of a semiconductor memory device in accordance with an embodiment.

Referring to FIG. 4, the semiconductor memory device in accordance with an embodiment of the present invention may have a PUC (peripheral under cell) structure. A peripheral circuit element P may be disposed under a memory cell array MCA which includes a channel structure CH, a plurality of gate lines 60 and a bit line BL.

In an embodiment, the peripheral circuit element P may include a block decoder 212. The peripheral circuit element P may further include at least one among a global line decoder (213 of FIG. 3), a page buffer circuit (220 of FIG. 1), a control logic (230 of FIG. 1), a voltage generator (240 of FIG. 1), a column decoder (250 of FIG. 1) and an input/output buffer (260 of FIG. 1). The memory cell array MCA may have a circuit configuration as illustrated in FIG. 2.

The peripheral circuit element P may be provided on a lower substrate 10, and the memory cell array MCA may be provided on an upper substrate 11.

The lower substrate 10 may be a monocrystalline silicon substrate. The lower substrate 10 may include a polysilicon substrate, a silicon-on-insulator (SOI) substrate or a germanium-on-insulator (GeOI) substrate. The lower substrate 10 may include any suitable semiconductor material such as, for example, Si, Ge or SiGe.

A first interlayer dielectric layer 21 which covers the peripheral circuit element P including the block decoder 212 may be formed on the lower substrate 10. The first interlayer dielectric layer 21 may include a dielectric layer such as, for example, a silicon oxide layer. Global row lines GRL and a wiring line 31 which are coupled to the block decoder 212 may be formed in the first interlayer dielectric layer 21.

The upper substrate 11 and a gate electrode 40 may be formed on the first interlayer dielectric layer 21. In an embodiment, the upper substrate 11 and the gate electrode 40 may be disposed in a planar manner on the top surface of the first interlayer dielectric layer 21. That is, the gate electrode 40 may be disposed at the same layer as the upper substrate 11.

The upper substrate 11 may be made, for example, of polycrystalline silicon. The upper substrate 11 may be formed by a method of forming a predetermined polycrystalline silicon region on the first interlayer dielectric layer 21 and growing polycrystalline silicon by using the predetermined polycrystalline silicon region as a seed layer. The gate electrode 40 may be formed at the same processing step as the upper substrate 11. In this case, the gate electrode 40 may be formed of the same material as the upper substrate 11 and may have the same height as the upper substrate 11. The upper substrate 11 and the gate electrode 40 may be separated from each other by a slit SLT. A dielectric layer pattern 50 may be filled in the slit SLT.

The channel structure CH which extends in the first direction FD that is perpendicular to the top surface of the upper substrate 11 may be formed on the upper substrate 11.

A second interlayer dielectric layer 22 may be formed on the upper substrate 11, the gate electrode 40 and the dielectric layer pattern 50. The second interlayer dielectric layer 22 may include a dielectric layer such as, for example, a silicon oxide layer. The plurality of gate lines 60 may be stacked on the second interlayer dielectric layer 22 along the first direction FD and may surround the channel structure CH. The gate lines 60 may correspond to the row lines RL described above with reference to FIG. 1. The gate lines 60 may be made of any suitable material including doped silicon, a metal (for example, tungsten), a metal nitride, a metal silicide or a combination thereof.

First dielectric layers 62 may be disposed on and under each of the gate lines 60. The first dielectric layers 62 may include silicon oxide layers. That is the gate lines 60 and the first dielectric layers 62 may be alternately stacked along the first direction FD.

The gate lines 60 may include at least one source select line SSL, a plurality of word lines WL1 to WL4 and at least one drain select line DSL. The source select line SSL, the word lines WL1 to WL4 and the drain select line DSL may be sequentially disposed from the second interlayer dielectric layer 22 along the first direction FD. A source select transistor may be formed where the source select line SSL surrounds the channel structure CH. Memory cells may be formed where the word lines WL1 to WL4 surround the channel structure CH. A drain select transistor may be formed where the drain select line DSL surrounds the channel structure CH. By this structure, a cell string including the source select transistor, the memory cells and the drain select transistor which are disposed along the channel structure CH may be provided.

The channel structure CH may include a cell channel layer 71 and a cell gate dielectric layer 72 which is disposed between the cell channel layer 71 and the gate lines 60. The cell channel layer 71 may include polysilicon or monocrystalline silicon, and may include a P-type impurity such as boron (B) in some regions. The cell channel layer 71 may have the shape of a tube in which a center region is open. A buried dielectric layer 73 may be formed in the open center region of the cell channel layer 71. The buried dielectric layer 73 may include a dielectric material such as a silicon oxide. While not shown, the cell channel layer 71 may have the shape of a pillar which is completely filled up to its center or a solid cylinder, and in this case, the buried dielectric layer 73 may be omitted.

The cell gate dielectric layer 72 may have the shape of a straw or a cylinder shell which surrounds the outer wall of the cell channel layer 71. While not shown, the cell gate dielectric layer 72 may include a tunnel dielectric layer, a charge storage layer and a blocking layer which are sequentially stacked from the outer wall of the cell channel layer 71. The tunnel dielectric layer may include a silicon oxide, a hafnium oxide, an aluminum oxide, a zirconium oxide or a tantalum oxide. The charge storage layer may include a silicon nitride, a boron nitride, a silicon boron nitride or polysilicon doped with an impurity. The blocking layer may include a single layer or a stack layer of a silicon oxide, a silicon nitride, a hafnium oxide, an aluminum oxide, a zirconium oxide and a tantalum oxide. In some embodiments, the cell gate dielectric layer 72 may have an ONO (oxide-nitride-oxide) stack structure in which an oxide layer, a nitride layer and an oxide layer are sequentially stacked.

The gate lines 60 may extend by different lengths along the second direction SD that is parallel to the top surface of the upper substrate 11, and may form a step structure on the gate electrode 40. In other words, each of the gate lines 60 may have a step portion which projects out of the gate line 60 of an upper layer in the second direction SD, and the gate electrode 40 may be disposed under the step portions of the gate lines 60 to overlap with the step portions of the gate lines 60 in the first direction FD.

A first pad part 74 which is electrically coupled to the cell channel layer 71 may be formed on the channel structure CH. The first pad part 74 may include polysilicon which is doped with an impurity. In an embodiment, second pad parts 75 which are electrically coupled to the gate lines 60, respectively, may be formed on the step portions of the gate lines 60. The second pad parts 75 may be formed at the same processing step as the first pad part 74. The top surfaces of the second pad parts 75 may be disposed at the same plane as the top surface of the first pad part 74. In this case, the second pad parts 75 may be provided with different heights.

First contacts 80 which are coupled to the second pad parts 75, respectively, and pass through the gate lines 60 and the first dielectric layers 62 in the first direction FD may be formed under the second pad parts 75. Sidewall dielectric layers 81 may be formed between the sidewalls of the first contacts 80 and the gate lines 60. Each of the sidewall dielectric layers 81 may have the shape of a straw or a cylinder shell which surrounds the outer wall of each first contact 80. A plurality of holes may be formed through the gate lines 60 and the first dielectric layer 62 in the first direction FD at positions corresponding to the step portions of the gate lines 60. The sidewall dielectric layers 81 may be formed on the side surfaces of the holes. After the sidewall dielectric layers 81 are formed, the first contacts 80 may be formed by filling the holes with a conductive material.

Cylindrical vertical channels 42 which couple the first contacts 80 to the global row lines GRL in the first interlayer dielectric layer 21 by passing through the second interlayer dielectric layer 22, the gate electrode 40 and the first interlayer dielectric layer in the first direction FD may be formed under the gate lines 60. The top end of each of the vertical channels 42 may be coupled to each first contact 80. Each of the vertical channels 42 may be electrically coupled to a corresponding gate line 60 through a corresponding first contact 80 and a corresponding second pad part 75. A plurality of vertical holes which exposing the global row lines GRL may be formed through the second interlayer dielectric layer 22 and, the gate electrode 40 and the first interlayer dielectric layer in the first direction FD at positions corresponding to the first contacts 80. A gate dielectric layers 44 may be formed by selectively oxidizing surfaces of the gate electrode 40 exposed by the vertical holes. After gate dielectric layers 44 are formed, vertical channels 42 may be formed by filling the vertical holes with a conductive material.

In an embodiment, the global row lines GRL may be disposed to overlap with the step portions of the gate lines 60 in the first direction FD, and the bottom end of each of the vertical channels 42 may be coupled to a corresponding global row line GRL in the first interlayer dielectric layer 21. As the material of the vertical channels 42, monocrystalline silicon or polysilicon may be used. The gate dielectric layers 44 may surround the outer walls of the vertical channels 42 between the vertical channels 42 and the gate electrode 40. The material of the gate dielectric layers 44 may include a silicon oxide layer (SiO2), a silicon nitride layer, and so forth.

By the above-described structure, vertical type transistors TR may be provided at the intersections between the gate electrode 40 and the vertical channels 42. The transistors TR may configure the pass transistors of the pass transistor circuit 211 described above with reference to FIG. 3. The transistors TR may share the gate electrode 40. The transistors TR may be disposed to overlap with the step portions of the gate lines 60 and the global row lines GRL in the first direction FD.

After forming the first pad part 74 and the second pad parts 75, a third interlayer dielectric layer 23 which covers the gate lines 60, the gate electrode 40, the first pad part 74 and the second pad parts 75 may be formed on the first interlayer dielectric layer 21. The third interlayer dielectric layer 23 may include a dielectric layer such as, for example, a silicon oxide layer.

A bit line contact BLC may be coupled to the first pad part 74 through the third interlayer dielectric layer 23. The bit line BL which is coupled to the bit line contact BLC may be formed on the third interlayer dielectric layer 23.

A top wiring line 92 which is coupled to the gate electrode 40 through a second contact 91 may be formed on the third interlayer dielectric layer 23. The top wiring line 92 and the bit line BL may be formed at the same processing step. The top wiring line 92 and the bit is line BL may be formed by depositing a metal film and patterning the metal film by a photolithography process. The top wiring line 92 may be coupled to the internal wiring line 31 which is formed in the first interlayer dielectric layer 21, through a third contact 93, and may be electrically coupled to the block decoder 212 through the internal wiring line 31. In an embodiment, the block decoder 212 may be disposed to overlap with the transistors TR in the first direction FD.

The gate electrode 40 of the transistors TR may be electrically coupled to the block decoder 212 through the second contact 91, the top wiring line 92, the third contact 93 and the internal wiring line 31, and may be provided with a block select signal from the block decoder 212. The transistors TR may be turned on in response to the block select signal provided from the block decoder 212, and may transfer the operation voltages applied to the global row lines GRL to the gate lines 60.

In embodiments to be described below with reference to FIGS. 5 and 6, the same technical terms and the same reference numerals will be used to refer to substantially the same components as the components of the embodiment described above with reference to FIG. 4, and repeated descriptions for the same components will be omitted herein.

Figure 5:
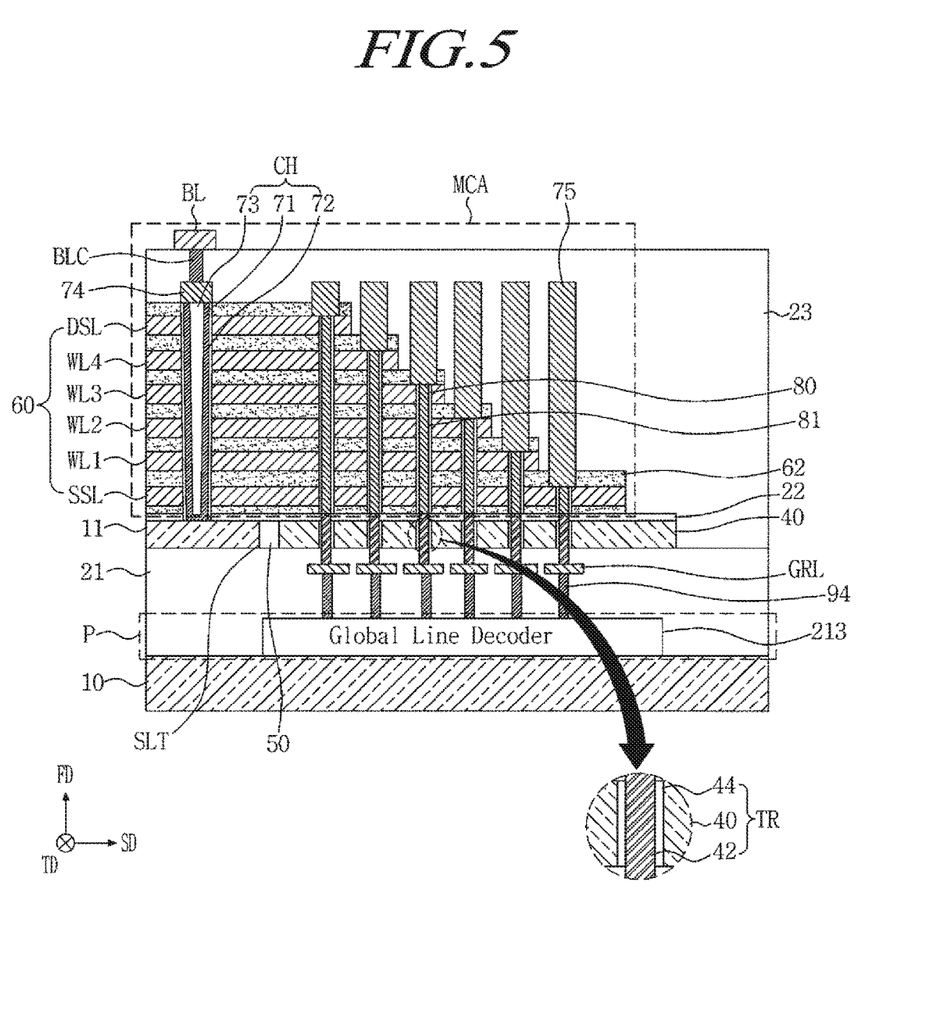
FIG. 5 is a cross-sectional view illustrating a representation of an example of a semiconductor memory device in accordance with an embodiment.

FIG. 5 is a cross-sectional view illustrating a representation of an example of a semiconductor memory device in accordance with an embodiment.

Referring to FIG. 5, a plurality of transistors TR which share a gate electrode 40 provided at the same layer as an upper substrate 11 are disposed under a memory cell array MCA to overlap with the memory cell array MCA in the first direction FD. In an embodiment, the gate electrode 40 of the transistors TR may be disposed to overlap with the step portions of gate lines 60 in the first direction FD. A global line decoder 213 may be disposed on a lower substrate 10 to overlap with the transistors TR in the first direction FD.

Global row lines GRL which are coupled to vertical channels 42 of the transistors TR may be disposed in a first interlayer dielectric layer 21. The global row lines GRL may be coupled to the global line decoder 213 through fourth contacts 94 which extend in the first direction FD. The bottom end of each of the vertical channels 42 of the transistors TR may be electrically coupled to the global line decoder 213 through a corresponding global row line GRL and a corresponding fourth contact 94. As described above with reference to FIG. 4, the top end of each of the vertical channels 42 of the transistors TR may be coupled to a corresponding gate line 60 through a corresponding first contact 80 and a corresponding second pad part 75.

By the above-described structure, the transistors TR may be electrically coupled between the global line decoder 213 and the gate lines 60, and may transfer operation voltages from the global line decoder 213 to the gate lines 60.

Figure 6:
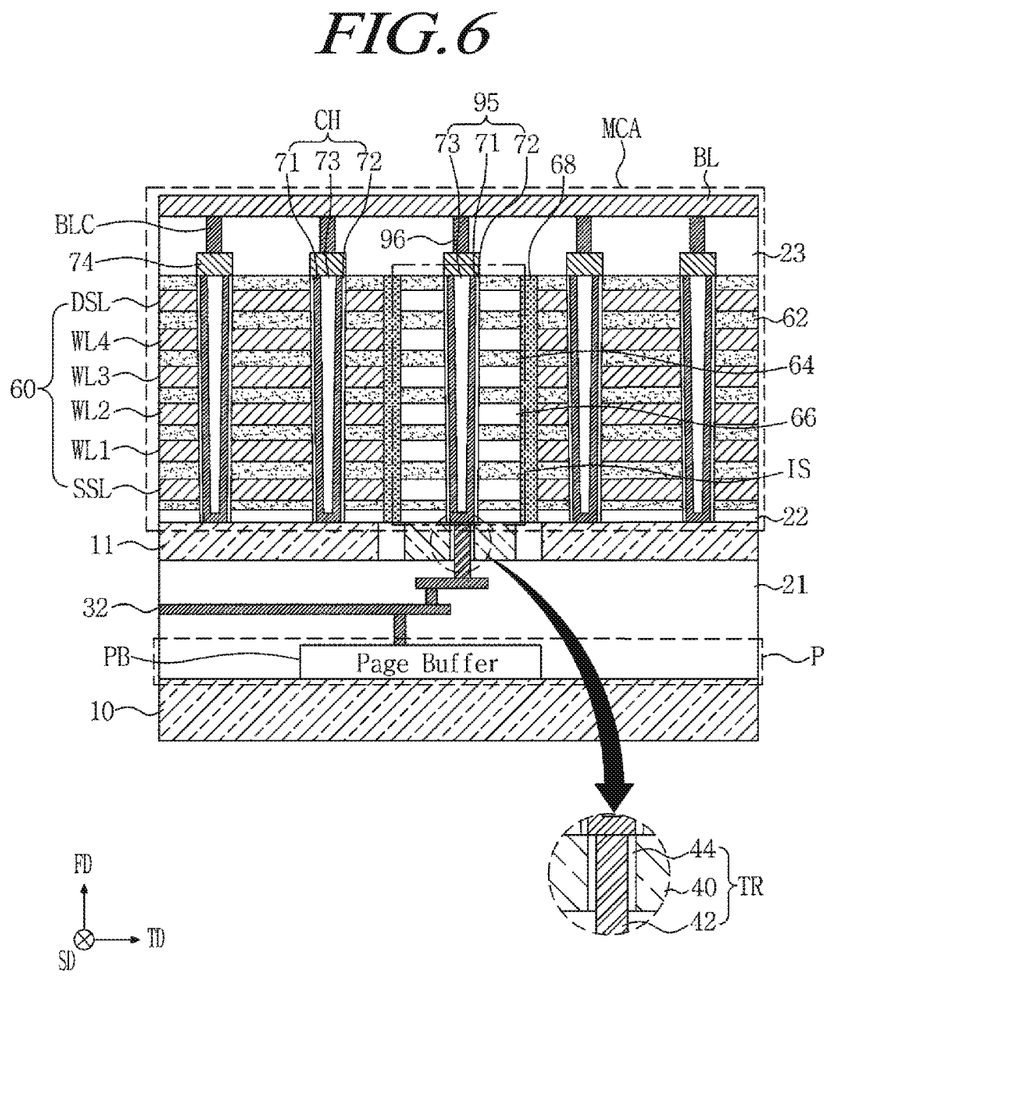
FIG. 6 is a cross-sectional view illustrating a representation of an example of a semiconductor memory device in accordance with an embodiment.

FIG. 6 is a cross-sectional view illustrating a representation of an example of a semiconductor memory device in accordance with an embodiment.

Referring to FIG. 6, a transistor TR which includes a gate electrode 40 provided at the same layer as an upper substrate 11 is disposed under a memory cell array MCA to overlap with the memory cell array MCA in the first direction FD.

In an embodiment, the memory cell array MCA may include a dielectric layer stack IS which is disposed to overlap with the transistor TR in the first direction FD. The dielectric layer stack IS may include a plurality of second dielectric layers 64 and a plurality of third dielectric layers 66 which are alternately stacked along the first direction FD. The second dielectric layers 64 may be formed at the same processing step as first dielectric layers 62. In this case, the second dielectric layers 64 may be formed of the same material as the first dielectric layers 62 and may have the same height as the first dielectric layers 62.

Gate lines 60 may be formed by alternately stacking the first dielectric layers 62 and sacrificial layers, removing the sacrificial layers and then filling doped silicon or a metal in spaces from which the sacrificial layers are removed. The third dielectric layers 66 may be formed at the same processing step as the sacrificial layers. In this case, the third dielectric layers 66 may be formed of the same material as the sacrificial layers. For example, the third dielectric layers 66 may be formed as silicon nitride layers. The third dielectric layers 66 may have substantially the same height as the gate lines 60.

A sidewall protection layer 68 may be formed between the gate lines 60 and the first dielectric layers 62 and the dielectric layer stack IS. The sidewall protection layer 68 plays the role of preventing the third dielectric layers 66 from being lost in a process for removing the sacrificial layers, and may be configured by a silicon oxide layer.

The top end of a vertical channel 42 of the transistor TR may be coupled to a fifth contact 95 which passes through the dielectric layer stack IS. The fifth contact 95 may be formed at the same processing step as channel structures CH. In this case, the fifth contact 95 may have substantially the same structure as the channel structures CH. For example, the fifth contact 95 may include a cell channel layer 71 and a cell gate dielectric layer 72. The cell channel layer 71 may have the shape of a tube in which a center region is open. A buried dielectric layer 73 may be formed in the open center region of the cell channel layer 71. In an embodiment, the cell channel layer 71 may have the shape of a pillar which is completely filled up to its center or a solid cylinder, and in this case, the buried dielectric layer 73 may be omitted. The cell gate dielectric layer 72 may have the shape of a straw or a cylinder shell which surrounds the outer wall of the cell channel layer 71. On the fifth contact 95, there may be formed a sixth contact 96 which passes through a third interlayer dielectric layer 23 and couples a bit line BL formed on the third interlayer dielectric layer 23 and the fifth contact 95.

The top end of the vertical channel 42 of the transistor TR may be coupled to the bit line BL through the fifth contact 95 and the sixth contact 96. The bottom end of the vertical channel 42 may be coupled to a page buffer PB through an internal wiring line 32 formed in a first interlayer dielectric layer 21.

By the above-described structure, the transistor TR may electrically couple the bit line BL and the page buffer PB in response to a page buffer control signal applied to the gate electrode 40.

In the above embodiments, since transistors for electrically coupling a memory cell array to a peripheral circuit element are disposed in such a way as to overlap with the memory cell array and the peripheral circuit element, the area occupied by the transistors may be reduced, and the size of a semiconductor memory device may be decreased.

Moreover, since transistors which electrically couple a memory cell array to a peripheral circuit element are disposed in such a way as to overlap with the memory cell array and the peripheral circuit element in a vertical direction, a wiring line which couples the transistor and the memory cell array and a wiring line which couples the transistor and the peripheral circuit element may be realized in a simplified layout.

Figure 7:
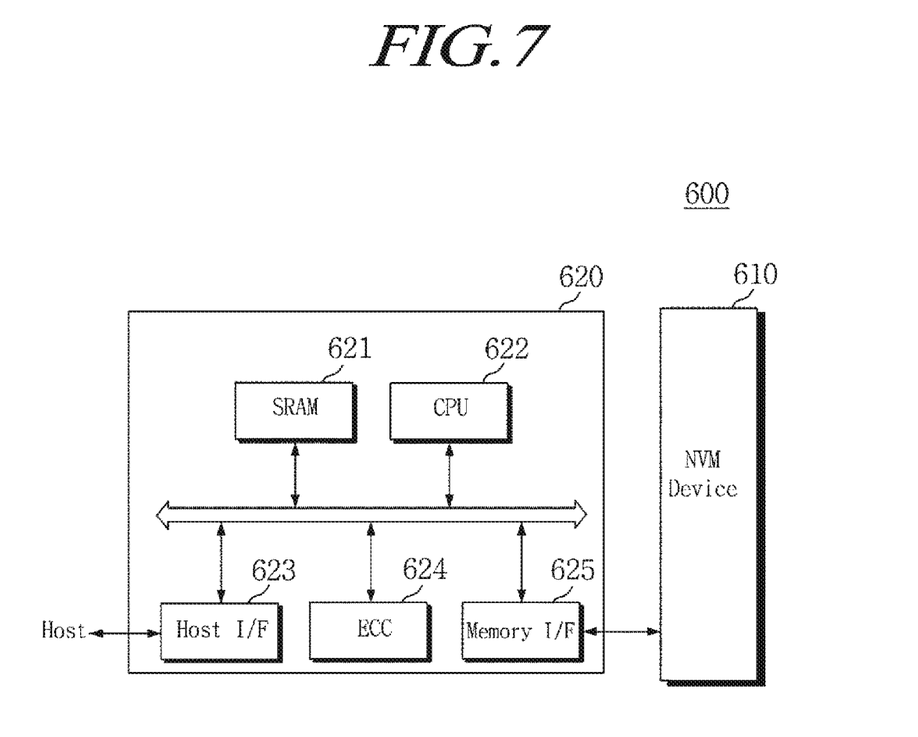
FIG. 7 is a simplified block diagram schematically illustrating a memory system including a semiconductor memory device in accordance with an embodiment.

FIG. 7 is a simplified block diagram schematically illustrating a memory system including a semiconductor memory device according to an embodiment of the present invention.

Referring to FIG. 7, the memory system 600 may include the semiconductor memory device 610 and a memory controller 620.

The semiconductor memory device 610 may be comprised the semiconductor memory device according to an embodiment of the invention as described above, and may be operated in the manner described above. The memory controller 620 may control the semiconductor memory device 610. For example, the combination of the semiconductor memory device 610 and the memory controller 620, may be configured as a memory card or a solid state disk (SSD). The memory controller 620 may include an SRAM 621, a central processing unit (CPU) 622, a host interface 623, an ECC block 624, a memory interface 625.

The SRAM 621 may be used as the working memory of the CPU 622. The host interface 623 may include the data exchange protocol of a host which may be coupled with the memory system 600.

The ECC block 624 may detect and correct an error included in the data read out from the semiconductor memory device 610.

The memory interface 625 may interface with the semiconductor memory device 610. The CPU 622 may perform general control operations for data exchange of the memory controller 620.

Although not shown, it should become apparent to a person skilled in the art that the memory system 600 may further be provided with a ROM which stores code data for interfacing with the host. The semiconductor memory device 610 may be provided as a multi-chip package constructed by a plurality of flash memory chips.

The memory system 600 may be used as a storage medium of high reliability having a low probability of an error occurring. The aforementioned nonvolatile memory device may be provided for a memory system such as a solid state disk (SSD). The memory controller 620 may communicate with an external device (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (integrated device electronics) protocol and the like.

Figure 8:
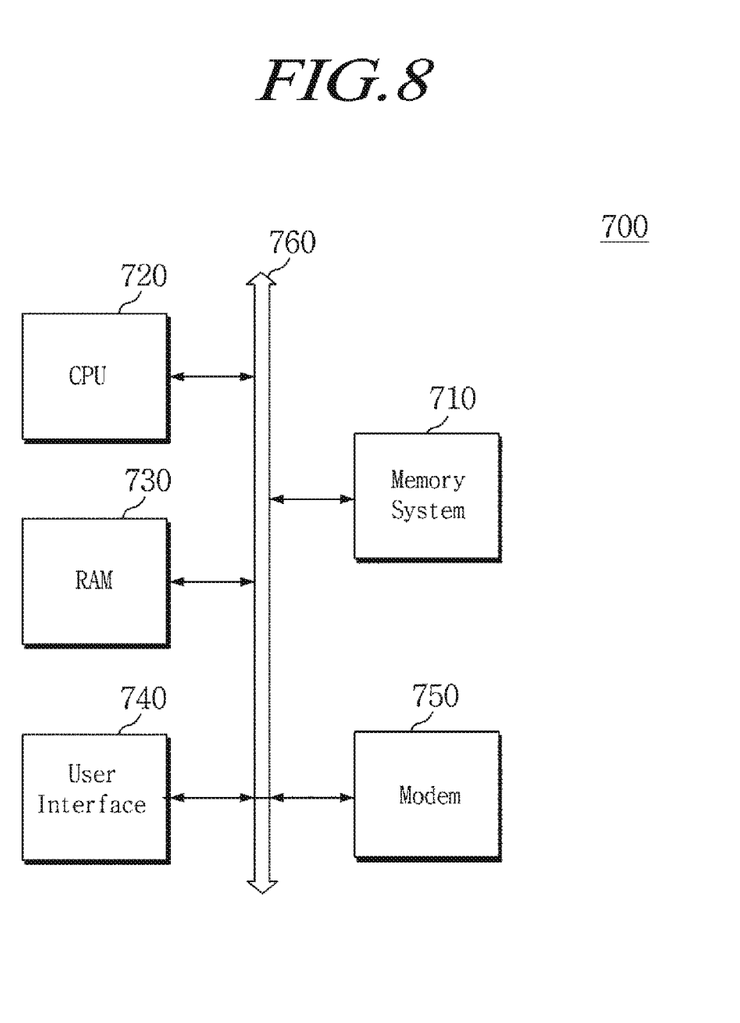
FIG. 8 is a block diagram schematically illustrating an example of a computing system including a semiconductor memory device in accordance with an embodiment.

FIG. 8 is a simplified block diagram schematically illustrating a computing system including a semiconductor memory device, according to an embodiment of the present invention.

Referring to FIG. 8, a computing system 700 according to an embodiment may include a memory system 710, a microprocessor (or CPU) 720, a RAM 730, a user interface 740, a modem 750 such as a baseband chipset, and, which are electrically coupled to a system bus 760. In an embodiment, the computing system 700 may be a mobile device, in which case a battery (not shown) for supplying the operating voltage of the computing system 700 may be additionally provided. Although not shown in the drawing, it should become apparent to a person skilled in the art that the computing system 700 may further comprise an application chipset, a CAMS image sensor (CIS), a mobile DRAM, and so on. The memory system 710 may be configured, for example, as an SSD (solid state drive/disk) which uses a nonvolatile memory to store data. Also as an example, the memory system 710 may be provided as a fusion flash memory (for example, a NAND or a NOR flash memory).

It is not that the above-described embodiments are realized only by a device and a method, and they may be realized also by a program which performs a function corresponding to the configuration of each embodiment or a recording medium on which the program is recorded. Such realization may be easily derived from the descriptions of the above-described embodiments by a person skilled in the art to which the embodiments pertain.

Although various embodiments have been described for illustrative purposes, it will be apparent to those skilled in the art that various changes and modifications may be made without departing from the spirit and scope of the invention as defined in the following claims.

What is claimed is:
1. A semiconductor memory device comprising:
a peripheral circuit element provided over a lower substrate;
an upper substrate provided over an interlayer dielectric layer which partially covers the peripheral circuit element;
a memory cell array including a channel structure which extends in a first direction perpendicular to a top surface of the upper substrate and a plurality of gate lines which are stacked over the upper substrate to surround the channel structure; and
a plurality of transistors electrically coupling the gate lines to the peripheral circuit element,
the transistors comprising:
a gate electrode provided over the interlayer dielectric layer and disposed to overlap with the memory cell array in the first direction;
a plurality of vertical channels passing through the gate electrode in the first direction and electrically coupled to the gate lines, respectively; and
gate dielectric layers disposed between the vertical channels and the gate electrode.
2. The semiconductor memory device according to claim 1,
wherein the gate lines extend at different lengths in the second direction to form a step area of the memory cell area, and
wherein the transistors are disposed to overlap with the step area of the memory cell area in the first direction.
3. The semiconductor memory device according to claim 2, further comprising:
a plurality of pads disposed over corresponding step portions of the gate lines in the step area and which are electrically coupled to the gate lines, respectively; and
a plurality of first contacts extending from top ends of the vertical channels in the first direction, passing through the corresponding step portions and which are electrically coupled to the pads, respectively.
4. The semiconductor memory device according to claim 3, wherein the pads are provided with different heights.
5. The semiconductor memory device according to claim 1,
wherein the peripheral circuit element includes a block decoder which is electrically coupled to the gate electrode, and
wherein the block decoder is disposed to overlap with the transistors in the first direction.
6. The semiconductor memory device according to claim 1, further comprising:
a plurality of global row lines provided in the interlayer dielectric layer and coupled to bottom ends, respectively, of the vertical channels.
7. The semiconductor memory device according to claim 6,
wherein the peripheral circuit element includes a global line decoder which is electrically coupled to the global row lines, and
wherein the global line decoder is disposed to overlap with the transistors in the first direction.
8. The semiconductor memory device according to claim 1, wherein the gate electrode has the same thickness as the upper substrate.
9. A semiconductor memory device comprising:
a peripheral circuit element provided over a lower substrate;
an upper substrate provided over an interlayer dielectric layer which covers the peripheral circuit element;
a memory cell array including a channel structure which extends in a first direction perpendicular to a top surface of the upper substrate, a plurality of gate lines which are stacked over the upper substrate to surround the channel structure and a bit line which is coupled to the channel structure; and a transistor electrically coupling the bit line to the peripheral circuit element,
the transistor comprising:
a gate electrode provided over the interlayer dielectric layer and disposed to overlap with the memory cell array in the first direction;
a vertical channel passing through the gate electrode in the first direction and electrically coupled to the bit line; and
a gate dielectric layer disposed between the vertical channel and the gate electrode.

10. The semiconductor memory device according to claim 9, wherein the gate electrode has the same thickness as the upper substrate.

11. The semiconductor memory device according to claim 9,
wherein the memory cell array further includes:
a plurality of first dielectric layers disposed over and under the gate lines; and
a dielectric layer stack including a plurality of second dielectric layers and a plurality of third dielectric layers alternately stacked along the first direction over the upper substrate, and
wherein the gate electrode is disposed to overlap with the dielectric layer stack in the first direction.

12. The semiconductor memory device according to claim 11, further comprising:
a sidewall protection layer disposed between the gate lines and the first dielectric layers and the dielectric layer stack, and surrounding an outer wall of the dielectric layer stack.

13. The semiconductor memory device according to claim 11, further comprising:
a fifth contact extending from a top end of the vertical channel in the first direction, and passing through the dielectric layer stack; and
a sixth contact disposed over the fifth contact, and electrically coupling the fifth contact and the bit line.

14. The semiconductor memory device according to claim 13, wherein the fifth contact has the same structure as the channel structure.

15. The semiconductor memory device according to claim 14, wherein the fifth contact comprises:
a cell channel layer extending in the first direction; and
a cell gate dielectric layer surrounding an outer wall of the cell channel layer.

16. The semiconductor memory device according to claim 9,
wherein the peripheral circuit element includes a page buffer which is electrically coupled to the vertical channel, and
wherein the page buffer is disposed to overlap with the transistor in the first direction.

17. A semiconductor memory device comprising:
a peripheral circuit element provided over a lower substrate;
an interlayer dielectric layer formed over the lower substrate, and covering the peripheral circuit element;
an upper substrate provided over the interlayer dielectric layer;
a memory cell array stacked over the upper substrate; and
a transistor provided between the memory cell array and the peripheral circuit element,
the transistor comprising:
a gate electrode disposed at the same layer as the upper substrate, and disposed to overlap with the memory cell array in the first direction;
a vertical channel passing through the gate electrode in the first direction; and
a gate dielectric layer disposed between the vertical channel and the gate electrode,
wherein the upper substrate and the gate electrode are disposed in a planar manner over a top surface of the interlayer dielectric layer.

18. The semiconductor memory device according to claim 17, wherein the transistor is disposed to overlap with the peripheral circuit element in the first direction.

19. The semiconductor memory device according to claim 17,
wherein the peripheral circuit element includes a block decoder which is electrically coupled to the gate electrode, and
wherein the block decoder is disposed to overlap with the transistor in the first direction.

20. The semiconductor memory device according to claim 17,
wherein the peripheral circuit element includes a page buffer which is electrically coupled to the vertical channel, and
wherein the page buffer is disposed to overlap with the transistor in the first direction.

* * * * *